United States Patent
Atkins et al.

(10) Patent No.: US 7,876,056 B2
(45) Date of Patent: Jan. 25, 2011

(54) MULTIPLE SENSOR VARIABLE ILLUMINATION LEVEL LIGHTING SYSTEM

(75) Inventors: Barry L Atkins, Goodlettsville, TN (US); Keith Alan Springs, Bowling Green, KY (US); Emmet Joseph Roche, Bowling Green, KY (US)

(73) Assignee: Heathco LLC, Elmhurst, IL (US)

( * ) Notice: Subject to any disclaimer, the term of this patent is extended or adjusted under 35 U.S.C. 154(b) by 612 days.

(21) Appl. No.: 11/675,918

(22) Filed: Feb. 16, 2007

(65) Prior Publication Data

US 2010/0283392 A1 Nov. 11, 2010

(51) Int. Cl.
H05B 41/36 (2006.01)

(52) U.S. Cl. .................. 315/291; 315/307; 315/308; 315/150

(58) Field of Classification Search ............. 315/86–93, 315/119, 127, 128, 121, 149, 150–157, 159, 315/291, 294, 295, 297, 299, 300, 301, 306, 315/307, 308, 361; 250/200, 201.1, 204, 250/205, 552, 554, 206, 206.1, 206.2, 206.3, 250/557, 208.1, 208.2, 208.4
See application file for complete search history.

(56) References Cited

U.S. PATENT DOCUMENTS

| | | | |
|---|---|---|---|
| 4,873,469 A | 10/1989 | Young et al. | |
| 5,027,662 A * | 7/1991 | Titlow et al. | 73/861.356 |
| 5,107,120 A | 4/1992 | Tom | |
| 5,406,083 A | 4/1995 | Sandell et al. | |
| 5,418,368 A | 5/1995 | Sandell et al. | |
| 5,424,718 A | 6/1995 | Muller et al. | |
| 5,434,821 A | 7/1995 | Watanabe et al. | |
| 5,453,622 A | 9/1995 | Sandell et al. | |
| 5,670,943 A | 9/1997 | DiPoala et al. | |
| 5,703,368 A | 12/1997 | Tomooka et al. | |
| 5,839,821 A | 11/1998 | LeZotte | |
| 5,923,250 A | 7/1999 | Pildner et al. | |
| 5,946,209 A * | 8/1999 | Eckel et al. | 700/14 |
| 6,175,309 B1 | 1/2001 | Drake et al. | |
| 6,323,488 B1 | 11/2001 | McCavit et al. | |
| 6,376,840 B1 | 4/2002 | Ko | |
| 6,781,129 B2 | 8/2004 | Leen | |
| 6,943,685 B2 | 9/2005 | Seo | |
| 6,943,687 B2 | 9/2005 | Lee et al. | |
| 2003/0179091 A1 | 9/2003 | Lee et al. | |
| 2005/0040947 A1 | 2/2005 | Buckley et al. | |
| 2005/0116171 A1 | 6/2005 | Lee et al. | |

(Continued)

OTHER PUBLICATIONS

U.S. Appl. No. 11/679,559; Filed: Feb. 27, 2007; Barry L. Atkins et al.; "Multiple Sensor Lighting System." The application and the last Response containing the updated claim set.

*Primary Examiner*—Douglas W Owens
*Assistant Examiner*—Jianzi Chen
(74) *Attorney, Agent, or Firm*—Fitch, Even, Tabin & Flannery (57) ABSTRACT

A circuit for operating a plurality of electrical devices at a plurality of varying power levels includes a plurality of motion sensor circuits for detecting motion relative thereto and having an a plurality of outputs conditioned upon motion detection. Additionally, a photocell sensor circuit for detecting a low ambient illumination level has an output command conditioned upon the detection of a predetermined illumination level that is electrically coupled to the control circuit having a plurality of inputs.

28 Claims, 4 Drawing Sheets

U.S. PATENT DOCUMENTS

2005/0258954 A1 11/2005 Ruskin
2007/0014105 A1* 1/2007 Noguchi et al. ............. 362/183
2007/0189000 A1 8/2007 Papamichael et al.

* cited by examiner

| SENSORS | | LIGHTS | | | |
|---|---|---|---|---|---|
| | | DUSK TIMER OFF | | DUSK TIMER ON | |
| LOOK DOWN - U4 | LOOK OUT - U1/U2 | LOOK DOWN - L2 | LOOK OUT - L1 | LOOK DOWN - L2 | LOOK OUT - L1 |
| 0 | 0 | OFF | OFF | LOW | OFF |
| 0 | 1 | OFF | HIGH | LOW | HIGH |
| 1 | 0 | HIGH | OFF | HIGH | LOW |
| 1 | 1 | HIGH | HIGH | HIGH | HIGH |

FIG. 4

MULTIPLE SENSOR VARIABLE ILLUMINATION LEVEL LIGHTING SYSTEM

BACKGROUND OF THE INVENTION

The present invention relates generally to a security or outdoor lighting system and more specifically to a lighting system capable of activating a plurality of lamps or other electrically operated devices at a plurality of electrical power levels based upon a plurality of sensed parameters including motion in multiple fields of view and ambient light level as sensed by a plurality of sensors.

DESCRIPTION OF THE RELATED ART

Electrical control circuitry incorporating photosensitive sensors have been employed in a wide variety of applications where it is desirable to activate a light source responsive to sensed ambient light. Prior art control systems that are also responsive to ambient light often incorporate integral motion sensors to activate a light or some other electrically operated security features based upon sensed movement proximate a motion sensor. In many systems, it is often necessary to sense the amount of ambient light as a precondition for light activation based on a motion event, since there is no need to turn on a security light, for example, in broad daylight.

However, many of these prior art systems have inherent drawbacks. In most illumination systems there is a necessity for turning on a security light in one location when motion is detected or sensed in another location. As one example, in a residential setting, a homeowner may want to turn on a security light located on or near the front or back door of the house when motion is sensed at a point proximate the adjacent walkway or driveway. In some prior art systems, a remote motion sensor is physically wired to interact with a switching system to activate the necessary lamps.

Additionally, many of these single motion sensor systems don't have the ability to sense motion in more than one "zone" or viewing area because of the inherent limitations of passive infrared sensor fields for detecting motion over either a wide or elongated viewing area. In response, many prior art systems utilize Fresnel lenses or the like to improve the field of motion detection for a given sensor mounted in a fixed location.

Additionally, many prior art detection and illumination systems employ a wide angle motion detector that is unable to detect motion in a desired coverage area based on the sensor's location. For example, in some applications motion detectors are aimed at a long narrow area such as a walkway or sidewalk where they are employed to activate a floodlight or the like. In such applications the single wide angle detector must be able to detect motion at either end of the walkway which often proves difficult depending upon placement and orientation of the sensor.

Furthermore, these single wide angle detector devices typically have viewing fields with uniform heights or depths. As such, their viewing fields can not be adjusted to configure the detector for a given application.

SUMMARY OF THE INVENTION

The present invention provides a control circuit and system including a plurality of sensors capable of controlling the operation of an electrical device such as a light or switch based upon a plurality of sensed parameters such as ambient light and motion. The invention utilizes a motion sensor circuit that may include a plurality of passive infrared sensors (PIR) and associated signal conditioning circuitry to provide at least one output signal representative of a motion event, or a plurality of motion events proximate the PIR sensors to a control circuit. The control circuit or other logic circuit, for example an application specific integrated circuit (hereinafter ASIC), may be suitably programmed with logic instructions to provide a concomitant data output to actuate a lamp responsive to a plurality of sensed conditions.

The invention further comprises a photocell circuit that provides an output to the control circuit representative of a low ambient light level on a photocell, whereby a lamp output or outputs may be conditioned upon a dusk or night event. A dusk timer and on timer circuit are also electrically connected to the control circuit to provide a user with the ability to condition the lamp output based upon a plurality of timer variables.

Additionally, the present invention includes a separate "look-down" motion sensor and circuit that, when operated in conjunction with the aforementioned first motion sensor circuit, enables the invention to detect a motion event at a distance outwardly from the placement of a separate "look-out" PIR sensor in an area covered by the beam pattern of the look-down sensor.

Both the look-out and look-down sensors and circuits are integrated with the photocell sensor circuit that enables the look-out and look-down sensors to activate a lamp or other device at either full intensity or partial intensity, conditioned upon the status of the photocell sensor circuit, as will be described in further detail herein below.

Other objects, features and advantages of the present invention will become apparent upon inspection of the detailed description of the preferred embodiments herein below taken in conjunction with the drawing Figures.

DETAILED DESCRIPTION OF THE PREFERRED EMBODIMENT(S)

Figure 1:
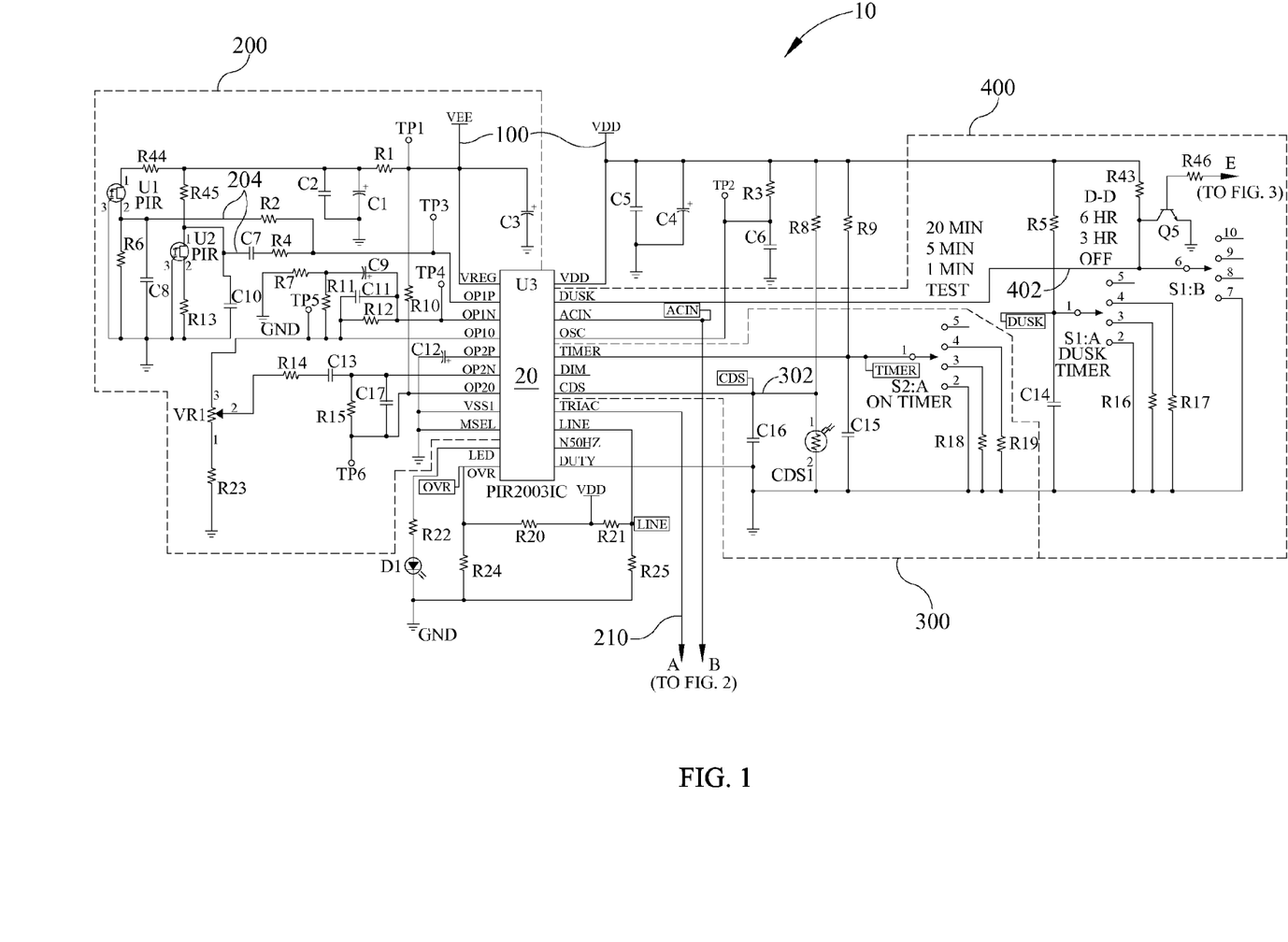
FIG. 1 is a block diagram of a wireless illumination system in accordance with one embodiment of the present invention.

Referring now to FIGS. 1-4, and in accordance with a preferred constructed embodiment of the present invention, an illumination system 10 capable of controlling the operation of a plurality of electrical devices such as lights or switches includes a first control circuit 20, shown in an exemplary fashion in FIG. 1 as an application specific integrated circuit (ASIC) U3 having a plurality of input and output pins for accepting a plurality of inputs and outputs as discussed further herein below.

While the ASIC U3 shown in FIG. 1 is specifically designed to operate with the various embodiments of the invention disclosed herein, it is recognized that a wide variety of commercially available integrated circuits, microprocessors or programmable logic controllers may serve the equivalent function as control circuit 20 without departing from the spirit or scope of the present invention.

A power supply circuit 100 includes a direct current voltage source VDD, which may be, for example, a conditioned AC voltage source for supplying DC power to illumination system 10. Power supply circuit 100 further comprises voltage source VEE which is a regulated direct current power output supplied by ASIC U3 to provides a constant 4.6 volts of regulated direct current power for the operation of sensor circuit 10 of the current invention.

The system 10 further comprises a first motion sensor circuit 200 which may include a plurality of PIR (passive infrared) sensors shown as U1 and U2 in FIG. 1 that are capable of sensing infrared radiation over a predetermined field of view and producing respective output signals 204 responsive to a threshold detected infrared radiation level. Output signals 204 are thus representative of a motion event within the range of detection of PIR sensors U1 and/or U2 and are electrically coupled to input pins OP1P/OP1N of ASIC U3. Pins OP1P and OP1N are the non-inverting and inverting input pins of an operational amplifier circuit integral to ASIC U3 that provides signal amplification and noise filtration for PIR sensor signals 204. A variety of differing types motion sensors may be used in place of PIR sensors U1 and U2 in conjunction with sensor circuit 200, for example ultrasonic sensors or other pyroelectric type sensors without departing from the scope of the present invention.

Detection system 10 further comprises a photocell circuit 300 including a photocell CDS1 having an output signal 302 representative of a predetermined level of ambient light impinging on sensor CDS1. Output signal 302 is electrically coupled to the CDS pin of ASIC U3 thus providing a signal indication to first control circuit 20 that the ambient lighting conditions are sufficiently dim to enable the activation of, for example, a lamp or lamps utilized as security lighting. This light may be activated at a reduced illumination level when no motion event has been detected, as will be discussed in greater detail herein below.

Additionally, a dusk timer circuit 400 provides a first dusk timer output signal 402 to a DUSK pin of ASIC U5, which is the ASIC employed to control a look-down motion sensor, to indicate to first control circuit 20 the duration of activation of an assigned output (for example to power a lamp) after night is detected by photocell CDS1. Dusk timer circuit 400 includes four position two-pole switch, shown in the drawing Figures as S1:A and S1:B for varying the length of time the assigned output is on after night is detected. When switch S1:A is in the D-D position (the "dusk-to-dawn" position) the DUSK input pin of ASIC U5 is not connected to VDD, thereby supplying a signal 402 voltage to the DUSK input pin of ASIC U5 representative of actuating the assigned output for the entire night, or until sufficient light impinges upon photocell CDS1.

When S1:A is in the 6 hour position the DUSK input pin of U5 is connected to VDD through resistor R17 thereby supplying a signal 402 voltage representative of actuating an assigned output for six hours after night is detected. When S1:A is in the 3.0 hour position, the DUSK input pin is connected to VDD through resistor R16 thereby supplying a signal 402 voltage representative of actuating the assigned output for three hours after night is detected. When SW1 is in the off position, VDD is applied to the DUSK pin, thereby indicating to ASIC U5 to inhibit operation of the dusk timer circuit.

ASIC U5 is used to control the operation of the DUSK timer by operation of switch S1:A. ASIC U5 provides an output signal on its DIM pin to the DUSK pin of ASIC U3 through transistor Q5 to indicate to ASIC U3 to operate an output at a lower power level. This feature of the instant invention provides for centralized control of the DUSK setting (or "dual-bright" setting) through ASIC U5 while enabling both ASIC U5 and U3 to operate outputs in either dim or full power modes.

Photocell circuit 300 may also comprise an on-timer switch S2:A having a plurality of switch positions that enable the manual selection of the amount of time an assigned output should be actuated conditioned upon the position of S2:A. As shown in FIG. 1, S2:A includes a test position, a 1 minute position, a 5 minute position and a 20 minute position. In the test position, S2:A disconnects a TIMER pin of U3 and U5 from any input, thereby signaling to ASICs U3 and U5 the actuation of the assigned output for an indefinite duration when any motion event is detected by PIR sensors U1, U2 or U4. Similarly, the 1 minute, 5 minute, and 20 minute timer positions of S2:A provide signals to ASICs U3 and U5 that indicate that the assigned output of each ASIC should be actuated for one, five or twenty minute, respectively, upon the sensing of a motion event by PIR U1 or U2.

While switches S1:A and S2:A are depicted in FIG. 1 as four position switches, it is to be understood that these are exemplary embodiments only, and that switches having a greater number of switch positions and concomitant resistors may be employed to provide a plurality of dusk timer intervals and on timer intervals without departing from the scope of the present invention.

Figure 3:
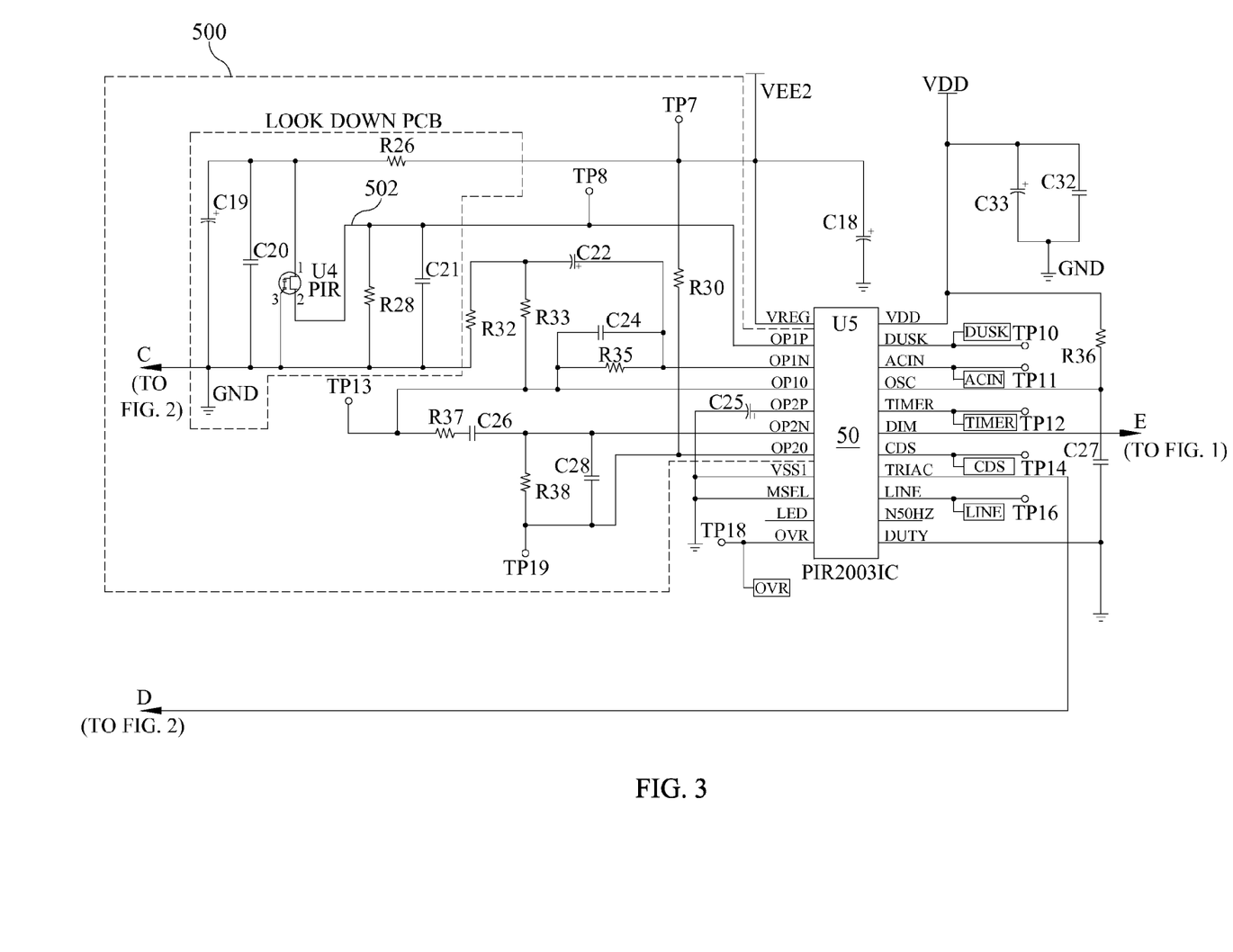
FIG. 3 is an exemplary external device to be activated in accordance with one embodiment of the present invention.

Referring now to FIG. 3 and in accordance with one embodiment of the invention, a second control circuit 50 comprises an ASIC U5 having a plurality of signal inputs and outputs for accepting a plurality of signal inputs and providing a plurality of signal outputs responsive thereto. In one embodiment of the instant invention ASIC U5 is identical in its physical architecture to ASIC U3 of first control circuit 20 and is capable of accepting PIR sensor and photocell sensor inputs as well as a plurality of other signal inputs.

Second control circuit 50 is coupled to second motion sensor circuit 500, which comprises a look-down PIR sensor U4 having a signal output 502 electrically coupled to input pin OP1P of ASIC U5. Output 502 provides a high logic level signal to ASIC U5 when a threshold level of infrared radiation is detected thereby, said threshold radiation level being indicative of a motion event within the field of view of PIR sensor U4.

Figure 2:
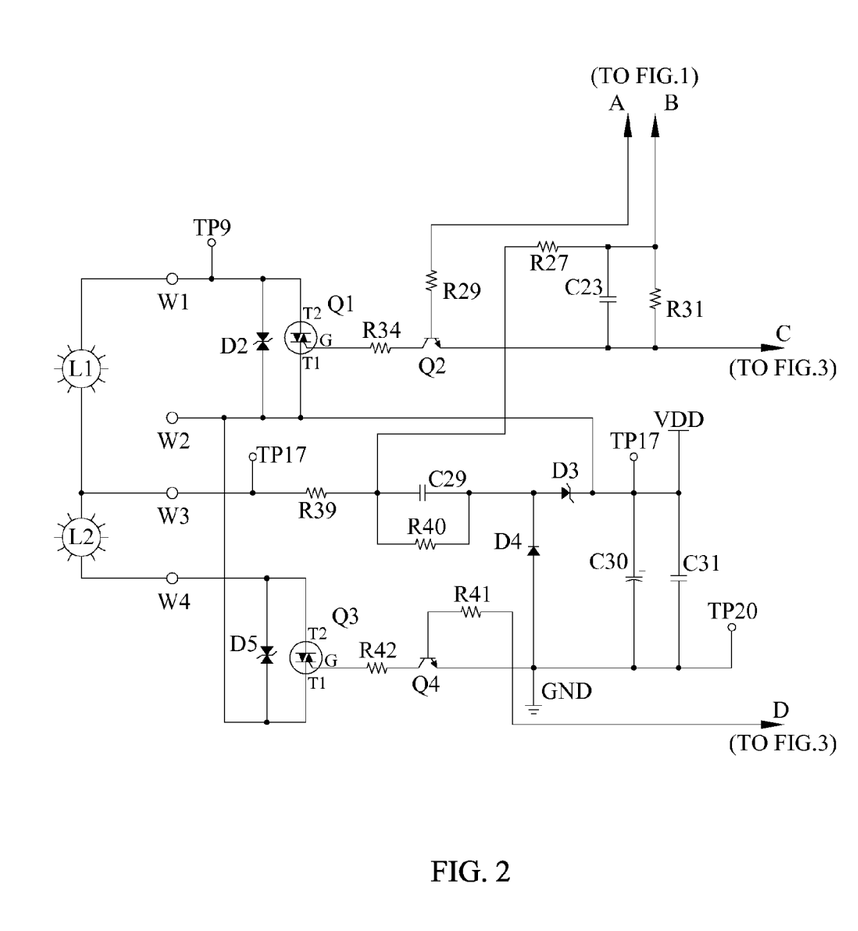
FIG. 2 is an electrical schematic of a circuit for detecting motion and ambient light and sending a remote command responsive thereto in accordance with one embodiment of the present invention.

Control circuit 50 includes a TRIAC output on the TRIAC pin of ASIC U5 that is may be cycled on and off at a plurality of different rates to fire a triac Q3. As shown in FIGS. 2 and 3, TRIAC pin of ASIC U5 is electrically connected to triac Q3 through transistor Q4 and resistor R41. The TRIAC pin is typically cycled on and off responsive to a motion event sensed by look down PIR sensor U4. Accordingly, an output voltage is provided at terminal W4 through triac Q3. A lamp L2 is connected between terminals W4 and W3 thereby providing illumination when a motion event is detected by look-down PIR sensor U4.

The operation of look-down lamp L2 is conditioned upon the operation of photocell CDS1, dusk timer switch S1:A, on timer switch S2:A and look-down PIR sensor U4. Where the DUSK pin of ASIC U5 is coupled to a signal from S1:A indicative of low power lamp operation, and when PIR sensor U4 is not sensing a motion event, lamp L2 is operated at low power by firing triac Q3 at a reduced rate. Where PIR sensor U4 detects a motion event, lamp L2 is operated at high power by firing triac Q3 at a higher rate. One of ordinary skill will recognize that the output provided between terminals W3 and W4 may operate any number of security devices including but not limited to audible alarms, lamps and inputs to other security or control systems.

First control circuit 20 also includes a TRIAC output 210 on its TRIAC pin that is electrically connected to triac Q1 through resistor R29 and transistor Q2. Triac output 210 is cycled high at two different predetermined rates—a low rate and a high rate—to enable the illumination of a lamp L1 connected between terminals W1 and W3 at two different illumination levels, similar to the operation of lamp L2. Accordingly, when photocell CDS1 has sensed a sufficiently low level of ambient light to activate its output 302, and when switch S1 is not positioned in "off" position, triac output 210 is cycled at its low rate to fire triac Q1 and thus illuminate lamp L1 at a low illumination level for a period of time determined by on-timer switch S2:A.

Figure 4:
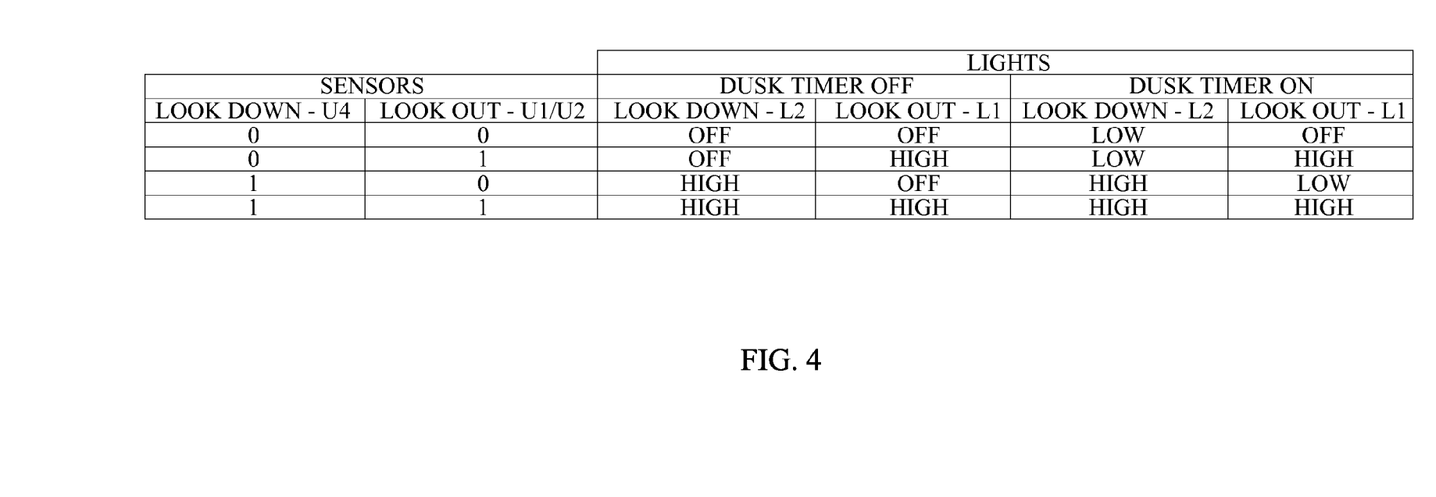
FIG. 4 is a table indicating lamp illumination levels based upon a plurality of sensor variables in accordance with one embodiment of the present invention.

FIG. 4 depicts a truth table indicating how lamps L1 and L2 are illuminated for various combinations of the states of look-down sensor U4 and look-out sensors U1 and U2 and dusk timer switch S1:A position. When dusk timer switch S1:A is in any position other than "off" it is considered on for purposes of the truth table in FIG. 4. As can be seen from the table, when the look out and look down sensors are not detecting motion events (a logical "0") and the dusk timer switch S1:A is off, both lamps remain off. When dusk timer switch S1:A is on but no motion event is detected, only lamp L2 is illuminated at low power. When a motion event is detected by look-down sensor U4, lamp L2 is always illuminated at high power. Similarly, when a motion event is detected by look-out sensors U1 and U2, lamp L1 is always illuminated at high power. This novel lighting arrangement provides a system for an aesthetically pleasing low power illumination while allowing the lamps to be illuminated at high power, independently of each other, when motion events are detected by their respective sensors.

In operation, ASICs U3 and U5 are provided with suitable resident programming instructions to enable the DIM output of ASIC U5 to be set high whenever switch S1:A is no in the off position, and remain high for the indicated predetermined amount of time after photocell circuit 300 detects the absence of illumination indicative of dusk, or from that point until photocell circuit 300 once again detects daylight. The DIM output of ASIC U5 then grounds the DUSK pin of U3 through Q5, thereby providing the corresponding signal to ASIC U3. When dim mode operation is indicated by photocell CDS1 and no motion event is detected by the PIR sensors U1 and U2, the TRIAC pin of ASIC U3 is cycled to provide a lower power level output. Similarly, where no motion event is detected by the PIR sensor U4 (and dim mode is selected) the TRIAC pin of ASIC U5 is cycled to provide a lower power level output.

Additionally, where timer switch S2:A is set to the test position, the TRIAC pin of ASIC U3 is cycled to provide a high power level output any time motion is detected by first motion sensor circuit 200. Where the timer switch S2:A is set to any other position, the TRIAC output of ASIC U3 is cycled to provide a high power level output when motion is detected by first motion sensor circuit 200 for the amount of time indicated by switch S2:A. TRIAC output of ASIC U3 is electrically coupled to lamp L1 through triac Q1 as best seen in FIGS. 1 and 3.

Similarly, ASIC U5 includes a TRIAC output that is electrically coupled to lamp L2 through triac Q3 as best seen in FIGS. 2 and 3. While the variable power level outputs from ASICs U3 and U5 are depicted as coupled to a plurality of lamps, one of ordinary skill will recognize that a plurality of electrically operated devices may be coupled to the variable power level output without departing from the scope of the present invention.

The various motion sensors of the present invention may employ Fresnel lenses to aid in focusing the specific coverage area or field of view of the sensors as an installation or application requires. In one embodiment of the invention, the look-out sensor has a field of view that covers a wide field of view, for example 270 degrees, while the look-down sensor is adapted to detect motion in a more narrow field of view proximate the sensor, for example 135 degrees.

While the present invention has been shown and described herein in what are considered to be the preferred embodiments thereof, illustrating the results and advantages over the prior art obtained through the present invention, the invention is not limited to those specific embodiments. Thus, the forms of the invention shown and described herein are to be taken as illustrative only and other embodiments may be selected without departing from the scope of the present invention, as set forth in the claims appended hereto.

We claim:

1. A circuit for operating a plurality of electrical devices at a plurality of power levels comprising:
    a first control circuit having a first motion sensor electrically coupled thereto and at least one photocell electrically coupled thereto, said first control circuit providing a first variable power output responsive to sensed motion and ambient light level as detected by said first motion sensor and said at least one photocell; and
    a second control circuit having a second motion sensor electrically coupled thereto and having a second variable power output responsive to sensed motion as detected by said second motion sensor and ambient light level as detected by said at least one photocell.

2. A circuit as claimed in claim 1 comprising:
    a dusk timer circuit comprising a selector switch having a dusk timer output operatively coupled to said first and second control circuits to activate said first and second variable power outputs at a low power level responsive to a predetermined ambient light level as detected by said at least one photocell.

3. A circuit as claimed in claim 2 wherein said first variable power output is activated at a high power level responsive to a sensed motion as detected by said first motion sensor, regardless of the level of ambient light detected by said at least one photocell.

4. A circuit as claimed in claim 2 wherein said second variable power output is activated at a high power level responsive to a sensed motion as detected by said second motion sensor, regardless of the level of ambient light detected by said at least one photocell.

5. A circuit as claimed in claim 1 comprising:
    an on timer switch having a plurality of switch positions for providing a plurality of input signals to said first and second control circuits indicative of a plurality of predetermined time periods for activation of said first and second variable power outputs responsive to sensed motion.

6. A circuit as claimed in claim 1 wherein said first control circuit comprises:
    an integrated circuit having a first input electrically coupled to said at least one photocell and a second input electrically coupled to said at least one motion sensor, said integrated circuit further having an output for controlling the power level of said first variable power output.

7. A circuit as claimed in claim 6 further comprising:
a first triac having an output electrically coupled to a first lamp and a gate electrically coupled to said first variable power output for illuminating said first lamp at a variable illumination level.

8. A circuit as claimed in claim 6 comprising:
a plurality of motion sensors having a plurality of outputs indicative of motion electrically coupled to the second input of said integrated circuit for detecting motion in a plurality of viewing fields.

9. A circuit as claimed in claim 1 wherein said second control circuit comprises:
an integrated circuit having a first input electrically coupled to said at least one photocell and a second input electrically coupled to said at least one motion sensor, said integrated circuit further having an output for controlling the power level of said first variable power output.

10. A circuit as claimed in claim 9 further comprising:
a second triac having an output electrically coupled to a second lamp and a gate electrically coupled to said second variable power output for illuminating said second lamp at a variable illumination level.

11. A circuit as claimed in claim 1 wherein said first motion sensor is arranged to detect motion in a first viewing field and said first variable power output is activated responsive to motion detected in the first viewing field; and
wherein said second motion sensor is arranged to detect motion in a second viewing field and said second variable power output is activated responsive to motion detected in the second viewing field.

12. A circuit as claimed in claim 1 comprising:
a plurality of motion sensors electrically coupled to said motion circuit for detecting motion in a plurality of viewing fields.

13. A circuit as claimed in claim 1 wherein said first and second variable power outputs are electrically coupled to first and second lamps, respectively.

14. A circuit as claimed in claim 1 wherein the at least one photocell comprises a single photocell.

15. A circuit for operating a plurality of electrical devices at a plurality of power levels comprising:
a first motion sensor circuit having at least one look-out motion sensor electrically coupled thereto, said look-out motion sensor having a motion signal output responsive to detected motion in a field of view;
a second motion sensor circuit having a look-down motion sensor electrically coupled thereto, said look-down motion sensor having a motion signal output responsive to detected motion in a field of view;
a photocell circuit having at least one photocell sensor electrically coupled thereto, said at least one photocell sensor having a sensor output responsive to a predetermined level of light impinging on said at least one photocell sensor; and
a control circuit having a first and second motion sensor inputs coupled to said look- out and look-down sensor outputs, and having a photocell sensor input coupled to said photocell sensor output, said control circuit further having a plurality of variable power level outputs for operating a plurality of electrical devices at a plurality of power levels.

16. A circuit as claimed in claim 14 further comprising:
an on-timer circuit operatively coupled to said control circuit, said on timer circuit having an output representative of a plurality of predetermined time periods for activation of said plurality of variable power level outputs responsive to sensed motion.

17. A circuit as claimed in claim 15 further comprising:
a dusk timer circuit having an output representative of a plurality of predetermined time periods for activation of said plurality of variable power level outputs responsive to a low ambient light level as detected by said at least one photocell.

18. A circuit as claimed in claim 16 wherein said first and second variable power levels outputs are activated at high power responsive to a motion event, and deactivated responsive to the expiration of a time period selected by said-ontimer circuit.

19. A circuit as claimed in claim 15 further comprising:
a dusk timer circuit having an output representative of a plurality of predetermined time periods for activation of said plurality of variable power level outputs responsive to a low ambient light level as detected by said at least one photocell.

20. A circuit as claimed in claim 15 wherein said control circuit comprises:
a first integrated circuit having a motion sensor input coupled to said look-out sensor output, and a variable power level ouput; and
a second integrated circuit having a motion sensor input coupled to said look-down sensor output, and a variable power level output.

21. A circuit as claimed in claim 15 wherein a first variable power level output is activated at low power responsive to said at least one photocell sensing a low level of ambient light.

22. A circuit as claimed in claim 15 wherein a second variable power level output is activated at low power responsive to said at least one photocell sensing a low level of ambient light.

23. A circuit as claimed in claim 15 wherein a first variable power level output is activated at low power responsive to said at least one photocell sensing a low level of ambient light and at high power responsive to said look-out sensor detecting motion.

24. A circuit as claimed in claim 23 wherein said first variable power level output is electrically coupled to the gate of a first triac, whereby said first triac provides an alternating current output.

25. A circuit as claimed in claim 15 wherein a second variable power level output is activated at low power responsive to said at least one photocell sensing a low level of ambient light and at high power responsive to said look-out sensor detecting motion.

26. A circuit as claimed in claim 25 wherein a second variable power level output is activated at low power responsive to said at least one photocell sensing a low level of ambient light and at high power responsive to said look-out sensor detecting motion.

27. A circuit as claimed in claim 15 wherein said first variable power level output is electrically coupled to the gate of a first triac, whereby said first triac provides an alternating current output.

28. A circuit as claimed in claim 15 wherein said second variable power level output is electrically coupled to the gate of a second triac, whereby said first triac provides an alternating current output.

* * * * *

UNITED STATES PATENT AND TRADEMARK OFFICE
CERTIFICATE OF CORRECTION

PATENT NO. : 7,876,056 B2  Page 1 of 1
APPLICATION NO. : 11/675918
DATED : January 25, 2011
INVENTOR(S) : Atkins et al.

It is certified that error appears in the above-identified patent and that said Letters Patent is hereby corrected as shown below:

Column 7, Claim 15, Line 57: Change "look- out" to -- look-out --;

Column 7, Claim 16, Line 63: Change "claim 14" to -- claim 15 --;

Column 8, Claim 17, Line 4: Change "claim 15" to -- claim 16 --;

Column 8, Claim 18, Line 11: Change "levels" to -- level --;

Column 8, Claim 18, Line 13: Change "said-ontimer" to -- said on timer --;

Column 8, Claim 20, Line 26: Change "ouput:" to -- output; --; and

Column 8, Claim 28, Line 62: Change "said first" to -- said second --.

Signed and Sealed this
Seventh Day of June, 2011

David J. Kappos
*Director of the United States Patent and Trademark Office*